United States Patent
Kim et al.

(10) Patent No.: US 10,109,767 B2
(45) Date of Patent: Oct. 23, 2018

(54) METHOD OF GROWING N-TYPE NITRIDE SEMICONDUCTOR, LIGHT EMITTING DIODE AND METHOD OF FABRICATING THE SAME

(71) Applicant: Seoul Viosys Co., Ltd., Ansan-si (KR)

(72) Inventors: Kyung Hae Kim, Ansan-si (KR); Jung Whan Jung, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 14/599,300

(22) Filed: Jan. 16, 2015

(65) Prior Publication Data

US 2015/0311382 A1 Oct. 29, 2015

(30) Foreign Application Priority Data

Apr. 25, 2014 (KR) .................. 10-2014-0050041
Aug. 19, 2014 (KR) .................. 10-2014-0107556

(51) Int. Cl.
*H01L 33/06* (2010.01)
*H01L 33/04* (2010.01)
*H01L 33/02* (2010.01)

(52) U.S. Cl.
CPC ............ *H01L 33/06* (2013.01); *H01L 33/025* (2013.01); *H01L 33/04* (2013.01)

(58) Field of Classification Search
CPC ........................................... H01L 33/04
See application file for complete search history.

(56) References Cited

U.S. PATENT DOCUMENTS

| | | | | |
|---|---|---|---|---|
| 2002/0171092 | A1* | 11/2002 | Goetz | B82Y 20/00 257/103 |
| 2010/0207100 | A1* | 8/2010 | Strassburg | B82Y 20/00 257/15 |
| 2012/0037881 | A1* | 2/2012 | Kim | H01L 33/007 257/13 |
| 2014/0209862 | A1* | 7/2014 | Ikuta | H01L 29/66462 257/22 |

FOREIGN PATENT DOCUMENTS

| | | |
|---|---|---|
| JP | 2000244013 | 9/2000 |
| KR | 1020140090801 | 7/2014 |

OTHER PUBLICATIONS

Korean Intellectual Property Office, Office Action for related Korean Application No. 10-2014-0107556, dated Nov. 11, 2015, 5 pages.

* cited by examiner

*Primary Examiner* — Lex Malsawma
*Assistant Examiner* — Xia Cross
(74) *Attorney, Agent, or Firm* — Perkins Coie LLP

(57) ABSTRACT

A light emitting diode includes: an n-type nitride semiconductor layer; an active layer over the n-type nitride semiconductor layer; and a p-type nitride semiconductor layer over the active layer. The n-type nitride semiconductor layer includes: an n-type nitride layer; a first intermediate layer over the n-type nitride layer; an n-type modulation-doped layer over the first intermediate layer. The light emitting diodes includes a second intermediate layer over the n-type modulation-doped layer. The second intermediate layer includes a sub-layer having a higher n-type doping concentration that an n-type doping concentration of the n-type modulation-doped layer.

18 Claims, 9 Drawing Sheets

(a)

(b)

METHOD OF GROWING N-TYPE NITRIDE SEMICONDUCTOR, LIGHT EMITTING DIODE AND METHOD OF FABRICATING THE SAME

PRIORITY CLAIMS AND CROSS-REFERENCE TO RELATED APPLICATION

This application claims priorities and benefits of Korean Patent Application Nos. 10-2014-0050041 filed on Apr. 25, 2014 and 10-2014-0107556 filed on Aug. 19, 2014, the contents of which are hereby incorporated by reference in their entirety.

TECHNICAL FIELD

The technology disclosed in this patent document relates to an n-type nitride semiconductor layer, and a light emitting diode.

BACKGROUND

Recently, a nitride semiconductor which is broadly used as a base material of a light emitting diode is fabricated by growing the nitride semiconductor on a homogeneous substrate such as a gallium nitride substrate or a heterogeneous substrate such as a sapphire substrate. However, since gallium nitride has a melting point of 2,000° C. or higher and a very high nitrogen vapor pressure, it is difficult to fabricate an ingot of gallium nitride. Accordingly, the nitride semiconductor is generally grown on a heterogeneous substrate such as a sapphire substrate, a silicon carbide (SiC) substrate, a silicon (Si) substrate, or the like.

SUMMARY

Examples of implementations of the technology disclosed in this patent document provide a method of growing an n-type nitride semiconductor layer which exhibits excellent crystallinity and electron injection efficiency.

In addition, examples of the technology disclosed in this patent document provide a light emitting diode and a method of fabricating the same, which permits uniform current spreading and exhibits excellent properties in terms of crystallinity of semiconductor layers and electron injection efficiency to provide high luminous efficiency.

In accordance with one aspect of the disclosed technology, a light emitting device is provided to include: an n-type nitride semiconductor layer; an active layer disposed over the n-type nitride semiconductor layer; and a p-type nitride semiconductor layer disposed over the active layer, wherein the n-type nitride semiconductor layer includes a n-type nitride base layer; a first intermediate layer disposed over the n-type nitride base layer; an n-type modulation-doped layer formed over the first intermediate layer; and a second intermediate layer disposed over the n-type modulation-doped layer, wherein the second intermediate layer includes a sub-layer having a higher n-type doping concentration than an n-type doping concentration of the n-type modulation-doped layer. The light emitting device provided according to one implementation of the disclosed technology can have high luminous efficiency and low forward voltage.

In some implementations, the second intermediate layer can include a superlattice layer including a stacked structure of a first sub-intermediate layer and a second sub-intermediate layer, the second sub-intermediate layer has a lower doping concentration than the first sub-intermediate layer, and the first sub-intermediate layer has an n-type dopant concentration of about $1 \times 10^{18}$ atoms/cm$^3$ or more.

In some implementations, the n-type modulation-doped layer can have an n-type dopant concentration equal to or more than about $1 \times 10^{18}$ atoms/cm$^3$, and the doping concentration of the n-type modulation-doped layer can be lower than that of the first sub-intermediate layer of the second intermediate layer.

In some implementations, the n-type modulation-doped layer can include a structure including relatively high doping concentration regions and relatively low doping concentration regions that form a stacked structure, and the relatively high doping concentration regions of the n-type modulation-doped layer have doping concentration that spatially varies from one of the relatively high doping concentration region positioned farther from the second intermediate layer to another relatively high doping concentration region positioned close to the second intermediate layer.

In some implementations, the second intermediate layer includes a superlattice structure including first sub-intermediate layers and one of the first sub-intermediate layers that is disposed relatively closer to the active layer can have a higher doping concentration than other first sub-intermediate layers that are disposed relatively farther from the active layer.

In some implementations, the light emitting device can further include a first superlattice layer disposed between the n-type nitride semiconductor layer and the active layer; and a second superlattice layer interposed between the first superlattice layer and the active layer, wherein the first superlattice layer can include a structure in which GaN layers and InGaN layers are repeatedly laminated one above another, and the second superlattice layer can include a structure in which $Al_xGa_{(1-x)}N$ layers and $Al_yGa_{(1-y)}N$ layers (0<x<1, 0<y<1, and y<x) are repeatedly laminated one above another.

In some implementations, the n-type modulation-doped layer can include a structure including relatively high doping concentration regions and relatively low doping concentration regions that form a stacked structure, and the n-type modulation-doped layer includes a relatively low doping concentration region at an uppermost portion of the n-type modulation-doped layer such that the second intermediate layer contacts with the relatively low doping concentration region.

In some implementations, the light emitting device further includes undoped nitride semiconductor layer disposed between the n-type nitride base layer and the first intermediate layer.

In another aspect, a light emitting device is provided to include: a first-impurity nitride-based layer formed over a substrate and having a relatively low doping concentration; a first intermediate layer formed over the first-impurity nitride-based layer and having a different composition than that of the n-type nitride-based layer; a first-impurity modulation-doped layer formed over the first intermediate layer and having a non-exposed portion and an exposed portion that have different impurity concentrations from each other; and a second intermediate layer formed over the exposed portion of the first-impurity modulation-doped layer and including first sub-intermediate layers and second sub-intermediate layers that are alternately disposed relative to each other, the first sub-intermediate layers having a different impurity concentration from the second sub-intermediate layers, and wherein the exposed portion of the first-impurity modulation-doped layer and the second intermediate layer form a mesa structure together with an active layer and a second-impurity nitride semiconductor layer that are formed over the second intermediate layer.

In some implementations, the exposed portion is disposed over the non-exposed portion and the exposed portion has a higher doping concentration than the non-exposed portion. In some implementations, the impurity concentration of the first-impurity modulation-doped layer is modulated to include high doping concentration not more than about $1 \times 10^{19}$ atoms/cm3 and a low doping concentration not less than about $1 \times 10^{18}$ atoms/cm3. In some implementations, the second sub-intermediate layers have a lower impurity concentration than the first sub-intermediate layers. In some implementations, the first sub-intermediate layers have a relative high energy band gap that facilitates electrons to be moved to the active layer. In some implementations, the second sub-intermediate layers have a greater thickness than the first sub-intermediate layers. In some implementations, first sub-intermediate layers have a higher doping concentration than the first-impurity modulation layer. In some implementations, the alternate arrangement of the first sub-intermediate layers and second sub-intermediate layers in the second intermediate layer allows a two-dimensional electron gas (2DEG) to be formed at each interface of the first and second sub-intermediate layers. In some implementations, the first sub-intermediate layer disposed closer to the active layer as compared to other first sub-intermediate layers has a higher doping concentration than other first sub-intermediate layers.

According to various implementation of the disclosed technology it is possible to secure uniform lateral current spreading and excellent properties in terms of crystallinity, electron injection efficiency and luminous efficiency.

DETAILED DESCRIPTION

Figure 1:
FIGS. 1 through 7 are cross-sectional views illustrating a method of growing an n-type nitride semiconductor layer and a semiconductor stack structure according to some implementations of the disclosed technology.

Nitride semiconductors fabricated using a heterogeneous substrate has high defect density at least partially due to differences in lattice parameter and coefficient of thermal expansion between the growth substrate and the nitride semiconductor. Particularly, the nitride semiconductor grown on the heterogeneous substrate tend to suffer from stress and strain caused by the difference in lattice parameter that causes piezoelectric polarization. In addition, a nitride semiconductor grown on a C-plane sapphire substrate has the C-plane as a growth plane and a nitride semiconductor grown in a normal direction to the C-plane suffers from spontaneous polarization. Such piezoelectric polarization and spontaneous polarization cause bending of an energy band of the nitride semiconductor, whereby holes and electron are separately distributed in an active layer. As a result, recombination efficiency of electrons and holes is reduced, which results in reduction in luminous efficiency, red-shifted light emission, and increase in forward voltage (Vf) of a light emitting device.

To overcome such problems of the nitride semiconductor, Korean Patent Application Publication No. 10-2013-0013968 discloses a technique for blocking defects by inserting an intermediate layer having a relatively high energy band-gap in an n-type semiconductor layer. However, such an intermediate layer has a greater energy band-gap than other semiconductor layers of the n-type semiconductor layer, which obstructs injection of electrons into the active layer and thus causes increase in forward voltage of the light emitting device.

In addition, since it is difficult for a typical light emitting diode to achieve uniform lateral current spreading over the whole light emitting area within the semiconductor layer, recombination of electrons and holes mainly occurs around an electrode pad. Accordingly, such a typical light emitting diode has reduced luminous intensity in some of the light emitting area and suffers from overall reduction in luminous efficiency.

In order to solve a problem of the light emitting diode suffering from inefficient current spreading within the semiconductor layer, techniques employing an electrode extension have been suggested including Korean Patent Application Publication No. 10-2008-0042340. However, such an electrode extension is formed by removing the active layer to form a contact area of the electrode extension with the semiconductor layer, thereby causing reduction in the light emitting area. Furthermore, even in the case where uniform current spreading can be achieved by the electrode extension, lateral current spreading does not smoothly occur within the semiconductor layer and thus, there is a limitation in achieving uniform current spreading over the whole light emitting area.

Examples of implementations of the disclosed technology provides for a light emitting diode which includes a structure capable of enhancing crystallinity by blocking defects of a nitride semiconductor, maintaining electron injection efficiency into an active layer, and achieving uniform lateral current spreading within a semiconductor layer.

Hereinafter, various exemplary implementations of the disclosed technology will be described in detail with reference to the accompanying drawings. The following descriptions of the various implementations are provided for illustrative purposes. In the drawings, certain dimensions such as widths, lengths, thicknesses, and the like of certain components may have been exaggerated for convenience. Throughout the specification, like reference numerals denote like elements having the same or similar functions.

It should be understood that a composition ratio, growth method, growth conditions, thickness, and the like of each of nitride semiconductor layers described in this patent document are provided for illustration only as examples and other implementations are also possible. For example, when a certain semiconductor is represented by AlGaN, the composition ratios of Al and Ga can be determined in various ways by a person having ordinary knowledge in the art (hereinafter, "those skilled in the art"), as needed. In addition, semiconductor layers described in this patent document can be grown by various methods, for example, metal organic chemical vapor deposition (MOCVD), molecular beam epitaxy (MBE), or hydride vapor phase epitaxy (HVPE), and the like. Herein, in the following implementations of the disclosed technology, the semiconductor layers will be illustrated as being grown in a growth chamber by MOCVD. In the course of growing the semiconductor layers, sources supplied into the growth chamber can include any other substitute sources. For example, a Ga source can include TMGa, or TEGa, and the like, an Al source can include TMAl, or TEAl, and the like, an In source can include TMIn, or TEIn, and the like, an N source can include $NH_3$, and an n-type dopant source can include silane. However, other implementations are also possible without limiting the sources to those as described.

Figure 8A:
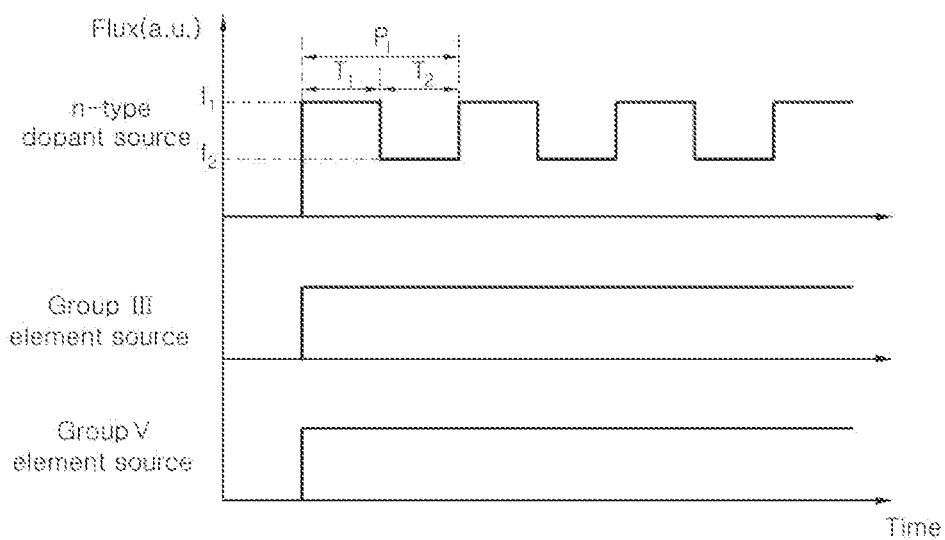
FIGS. 8a through 8c are graphs showing flux-time relationships of an n-type dopant source, a Group III element source, and a Group V element source supplied to a growth chamber when growing an n-type modulation-doped layer according to some implementations of the disclosed technology.
Figure 8B:
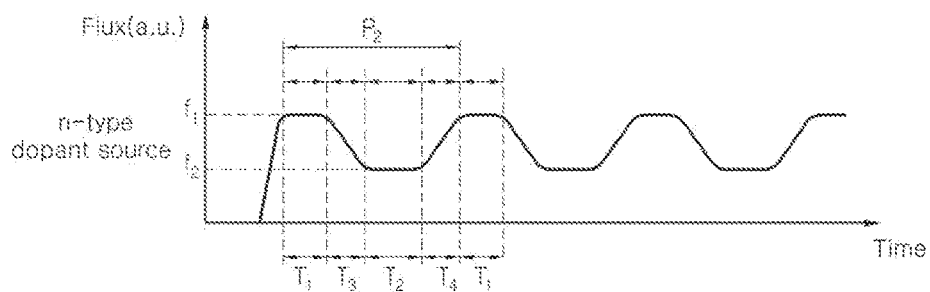
Figure 8C:
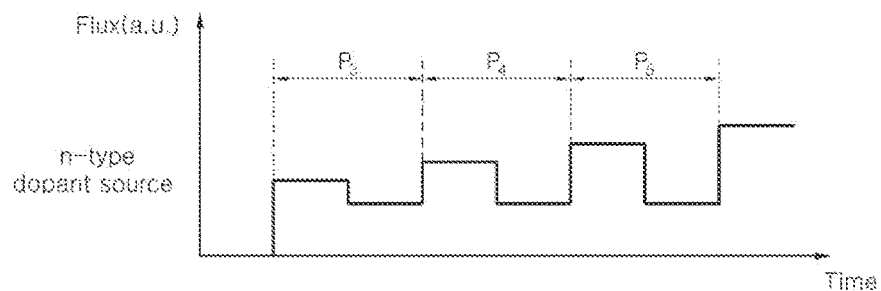
Figure 8D:
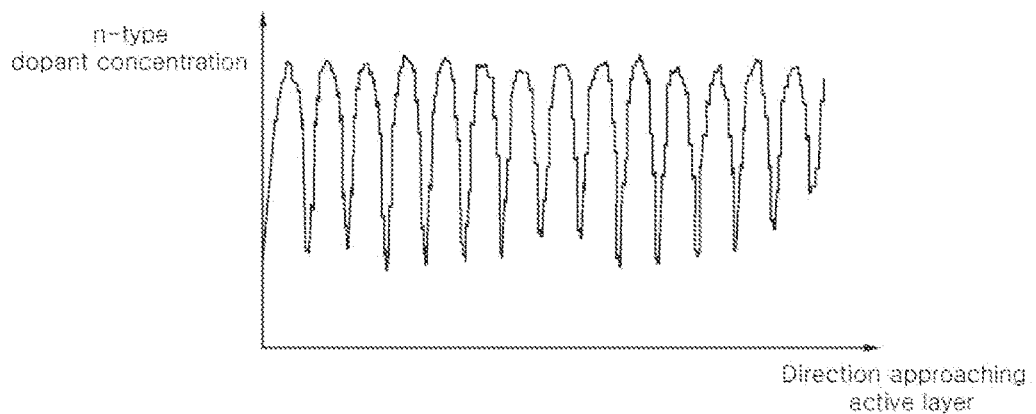
FIG. 8d is a graph depicting an n-type dopant concentration of an n-type modulation-doped layer according to some implementations of the disclosed technology.
Figure 9A:
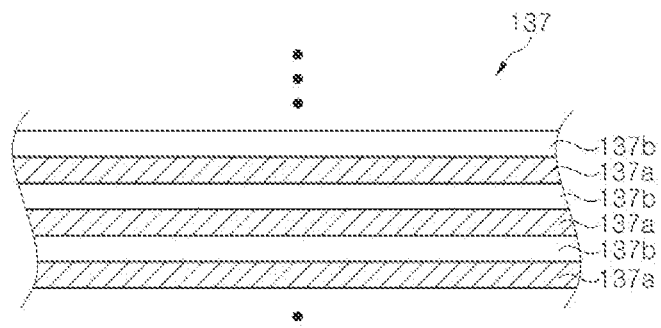
FIG. 9a and FIG. 9b are graphs showing flux-time relationships of an n-type dopant source, a Ga source, an Al source, and an N source supplied to a growth chamber when growing a second intermediate layer and a cross-sectional view illustrating a structure of the second intermediate layer according to embodiments of the disclosed technology.
Figure 9A:
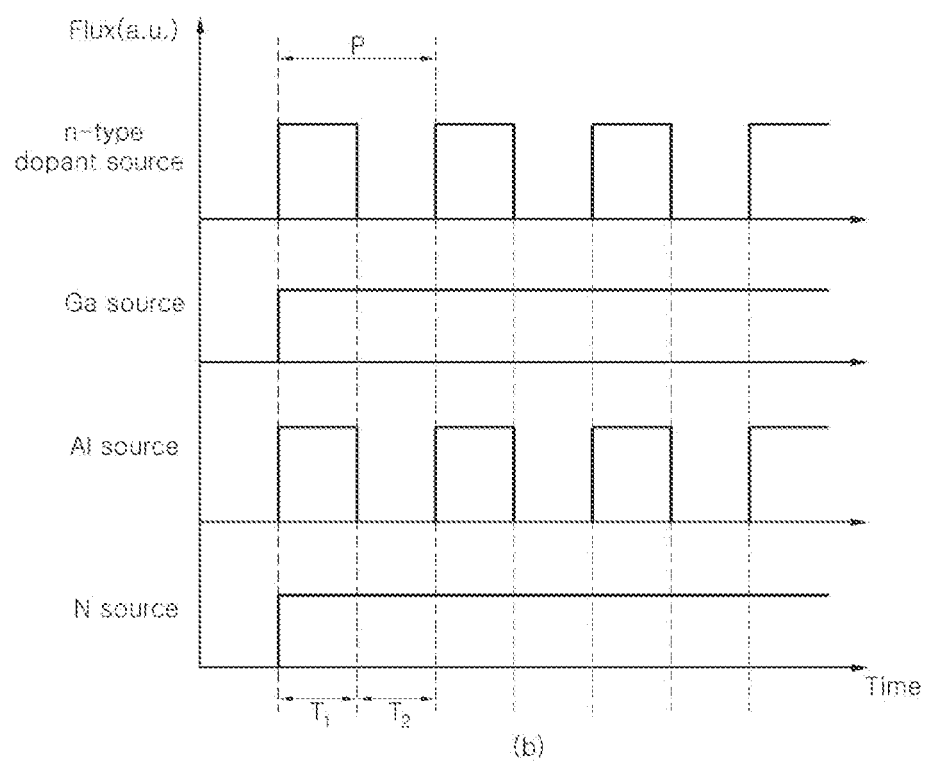
Figure 9B:
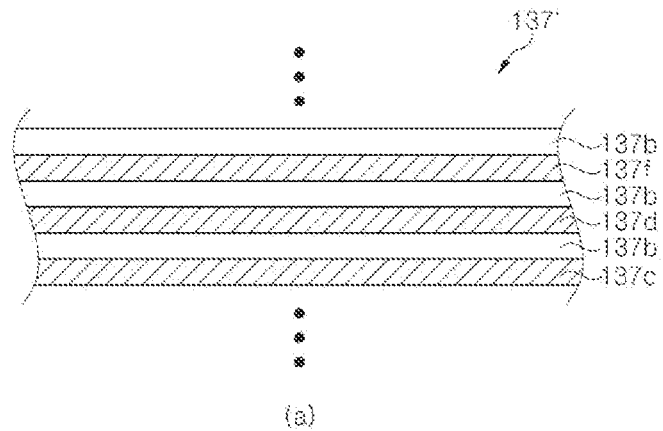
Figure 9B:
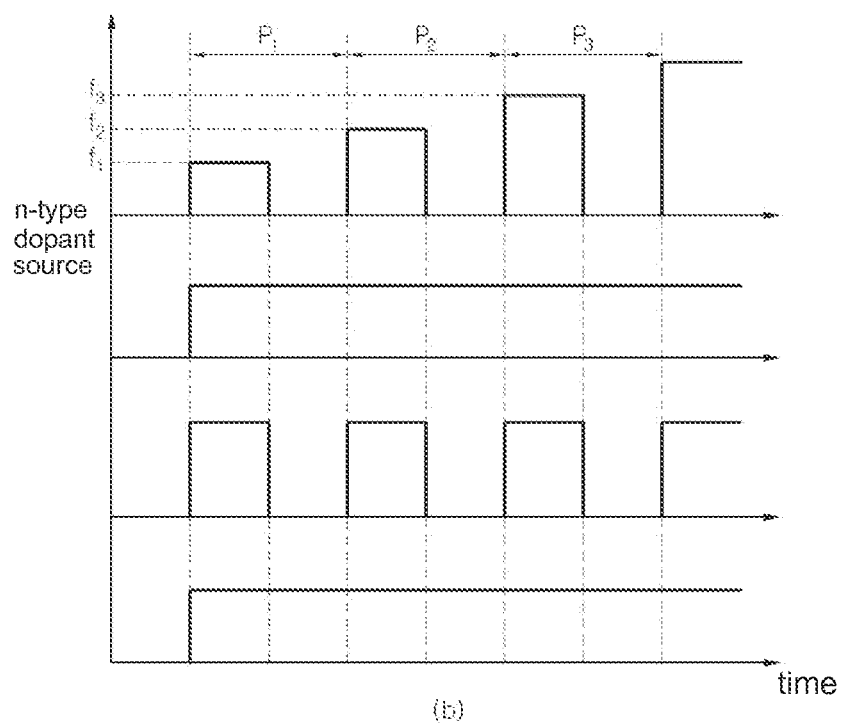

FIG. 1 to FIG. 7 are cross-sectional views illustrating a method of growing an n-type nitride semiconductor layer and a semiconductor stack structure according to some implementations of the disclosed technology. FIGS. 8a through 8c are graphs showing flux-time relationships of an n-type dopant source, a Group III element source, and a Group V element source supplied to a growth chamber when growing an n-type modulation-doped layer according to some implementations of the disclosed technology. FIG. 8d is a graph depicting an n-type dopant concentration of an n-type modulation-doped layer according to some implementations of the disclosed technology. In addition, FIG. 9a and FIG. 9b are graphs showing flux-time relationships of an n-type dopant source, a Ga source, an Al source, and an N source supplied to a growth chamber when growing a second intermediate layer and cross-sectional views illustrating a structure of the second intermediate layer according to embodiments of the disclosed technology. A light emitting diode can be fabricated using the semiconductor stack structure fabricated consistent with the method of growing an n-type semiconductor layer as illustrated in FIGS. 1 through 7.

Referring to FIG. 1, a substrate 110 is disposed within a growth chamber.

The substrate 110 can be any substrate which can permit growth of a nitride semiconductor layer thereon, and can include an insulating or conductive substrate. For example, the substrate 110 can include a sapphire substrate, a silicon substrate, a silicon carbide substrate, an aluminum nitride substrate, or a gallium nitride substrate. In this implementation, the substrate 110 can be a patterned sapphire substrate (PSS) which has a convex-concave (not shown) pattern formed on or over an upper surface of the substrate 110, and the PSS can include a C-plane as a growth plane. However, other implementations are also possible without limiting the substrate 110 to those as described.

Figure 2:
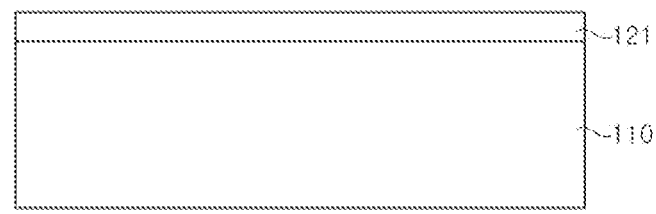

Referring to FIG. 2, a buffer layer 121 can be formed on or over the substrate 110.

The buffer layer 121 can include AlGaN and/or GaN, and can be grown on the substrate 110 at a temperature of about 500° C. to about 600° C. The buffer layer 121 can act as a nucleus layer for growing a nitride semiconductor when the substrate 110 is or includes a heterogeneous substrate with respect to the nitride semiconductor, and can relieve stress and strain caused by lattice mismatch between the substrate 110 and the nitride semiconductor 110 grown on the buffer layer 121. In some implementations, the buffer layer 121 can be omitted.

Referring to FIG. 3 to FIG. 6, an n-type nitride semiconductor layer 130 is formed on or over the buffer layer 121. A method of growing the n-type nitride semiconductor layer 130 will be described in more detail.

Figure 3:
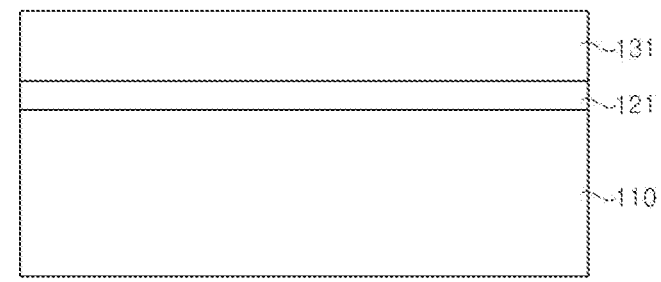

Referring to FIG. 3, a lower n-type nitride layer 131 can be formed on or over the buffer layer 121.

The lower n-type nitride layer 131 can be grown by supplying a Group III element source, such as Al, Ga, or In, and the like, a Group V element source such as N, and an n-type dopant source such as Si into the growth chamber. For example, the lower n-type nitride layer 131 can include an n-type GaN layer. The lower n-type nitride layer 131 can be grown to a thickness of, for example, about 0.5 μm to 1.5 μm. However, other implementations are also possible without limiting the n-type nitride layer 13 to those as described. In addition, as described below, the lower n-type nitride layer 131 can have a lower n-type dopant concentration than a maximum n-type dopant concentration in a high doping concentration region of an n-type modulation-doped layer 135.

When the lower n-type nitride layer 131 has a relatively low doping concentration, the lower n-type nitride layer 131 disposed relatively close to the substrate 110 can have enhanced crystallinity, thereby securing excellent crystallinity of semiconductor layers grown by subsequent processes.

Figure 4:
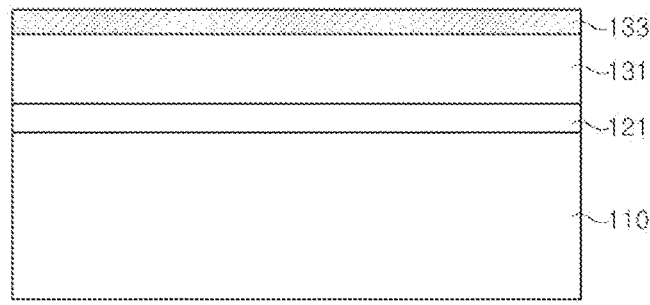

Referring to FIG. 4, a first intermediate layer 133 is formed on or over the lower n-type nitride layer 131.

The first intermediate layer 133 can be grown by supplying a Group III element source, such as Al, Ga, or In, and the like, and a Group V element source such as N into the growth chamber. The first intermediate layer 133 can include a nitride semiconductor having a different composition than that of the lower n-type nitride layer 131. In some implementations, the first intermediate layer 133 includes an AlGaN layer. In one implementation, the first intermediate layer 133 can be or include an n-type doped layer or an undoped layer.

The first intermediate layer 133 can include the nitride semiconductor having a different composition than that of the lower n-type nitride layer 131 to prevent dislocation formed upon growth of the lower n-type nitride layer 131 from propagating to other semiconductor layers to be grown by subsequent processes. Thus, the first intermediate layer 133 can enhance crystallinity of the n-type nitride semiconductor layer 130 and the light emitting diode according to embodiments of the disclosed technology.

Figure 5:
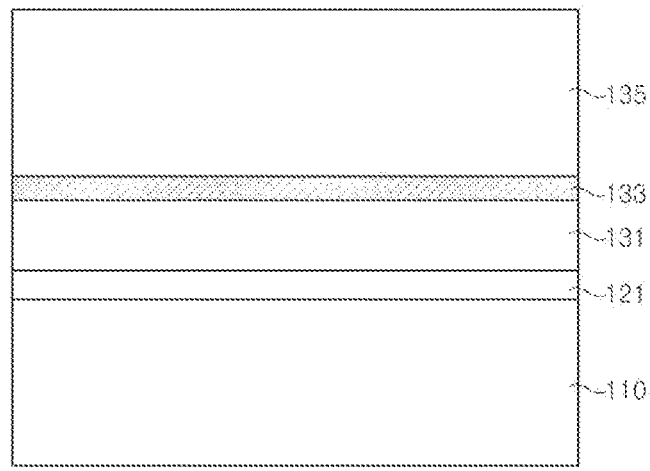
Figure 6:
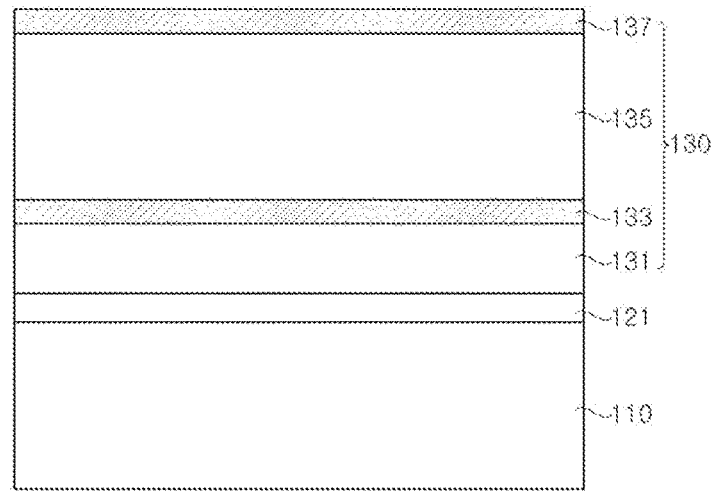

Next, referring to FIG. 5, an n-type modulation-doped layer 135 is formed on or over the first intermediate layer 133.

The n-type modulation-doped layer 135 has a structure in which the concentration of an n-type dopant is modulated. A method of forming the n-type modulation-doped layer 135 will be described later in more detail with reference to FIG. 8a to FIG. 8c.

The n-type modulation-doped layer 135 can be grown by supplying a Group III element source such as Al, Ga, or In, and the like, a Group V element source such as N, and an n-type dopant source such as Si into the growth chamber. The n-type dopant source can be supplied under the condition that the flux of the n-type dopant source is not constant. That is, the method of growing the n-type modulation-doped layer 135 includes varying, for example, increasing and decreasing the flux of the n-type dopant source at least once in the course of growing the n-type modulation-doped layer. During growth of the n-type modulation-doped layer 135, the flux of the n-type dopant source can be regularly or irregularly changed over time.

Referring to FIG. 8a, during growth of the n-type modulation-doped layer 135, the Group III element source, the Group V element source, and the n-type dopant source are supplied into the growth chamber. At this time, the fluxes of the Group III element source and the Group V element source can be kept constant. The n-type dopant source can be supplied by repeating a cycle P1 during which the n-type dopant source is supplied at a first flux f1 for a period of time T1 and then the n-type dopant source is supplied at a second flux f2 for a period of time T2.

Although the flux of the n-type dopant source is illustrated as being discontinuously changed in FIG. 8a, it should be understood that the disclosed technology is not limited hereto and other implementations are also possible. For example, the flux of the n-type dopant source can be continuously changed. Accordingly, the method of growing the n-type modulation-doped layer 135 can further include changing the flux of the n-type dopant source over time.

For example, referring to FIG. 8b, the n-type dopant source can be supplied by repeating a cycle P2 during which the n-type dopant source is supplied at the first flux f1 for the period of time T1 and the flux of the n-type dopant source is gradually reduced from the first flux f1 to the second flux f2 for a period of time T3 after the period of time T1, the n-type dopant source is supplied at the second flux f2 for the period of time T2 after the period of time T3, and then, the flux of the n-type dopant source is gradually increased from the second flux f2 to the first flux f1 for a period of time T4 after the period of time T2.

Further, although the flux of the n-type dopant source is illustrated in FIGS. 8a and 8b to change during each cycle to have the same variation between the first flux f1 and the second flux f2, it should be understood that other implementations are also possible such that the flux of the n-type dopant source can be differently changed during each cycle.

For example, as shown in FIG. 8c, when the n-type dopant source is supplied into the growth chamber in cycles P3 to P5, the flux of the n-type dopant source can be adjusted such that a maximum flux of the n-type dopant source in each cycle gradually increases during the cycles P3 to P5. In this case, during growth of the n-type modulation-doped layer 135, when the maximum flux of the n-type dopant source is defined as the first flux in each of the cycles, the first flux in a subsequent cycle can be faster than the first flux in a preceding cycle.

However, it should be understood that the disclosed technology is not limited to the above examples and other implementations are also possible. For example, the flux of the n-type dopant source can be changed in various manners to increase or decrease the flux of the n-type dopant source during growth of the n-type modulation-doped layer 135.

Referring back to FIG. 5, the concentration of the n-type dopant in the n-type modulation-doped layer 135 grown by the process of supplying the n-type dopant source is modulated in a growth direction of the n-type modulation-doped layer 135. Accordingly, the n-type dopant concentration of the n-type modulation-doped layer 135 can be changed as shown in FIG. 8d. At this time, the n-type modulation-doped layer 135 can have an n-type dopant concentration equal to or more than $1 \times 10^{17}$ atoms/cm$^3$. It is noted that a high doping concentration region can have a maximum doping concentration between about $5 \times 10^{18}$ atoms/cm$^3$ and about $1 \times 10^{20}$ atoms/cm$^3$ and a low doping concentration region can have a minimum doping concentration between about $5 \times 10^{17}$ atoms/cm$^3$ and about $3 \times 10^{18}$ atoms/cm$^3$. For example, the high doping concentration region can have a maximum doping concentration of about $1 \times 10^{19}$ atoms/cm$^3$ and the low doping concentration region can have a minimum doping concentration of about $1 \times 10^{18}$ atoms/cm$^3$. The n-type modulation-doped layer 135 can have a thickness of about 2 μm to about 3 μm, and pairs of the high doping concentration region and the low doping concentration region can be repeated in about 100 to 200 cycles. Here, the high doping concentration region can have substantially the same thickness as that of the low doping concentration region. However, other implementations are also possible.

As the n-type nitride semiconductor layer 130 includes the n-type modulation-doped layer 135, the light emitting diode can uniformly distribute current in a horizontal direction when current is applied to the light emitting diode. As a high doping concentration region and a low doping concentration region are repeatedly laminated one above another within the n-type modulation-doped layer 135, a barrier can be formed in a vertical direction with respect to an electron channel, thereby promoting electron movement in the horizontal direction. Since electron mobility is inversely proportional to the doping concentration, an excessively high doping concentration decreases the electron mobility, thereby constraining current spreading. Further, an excessively low doping concentration increases resistance of a semiconductor, thereby constraining current spreading. According to the disclosed technology, there is an effect in that electrons injected into the high doping concentration regions through the n-type modulation-doped layer 135 can be horizontally distributed in the low doping concentration regions.

Furthermore, since the n-type modulation-doped layer 135 includes the high doping concentration regions, it is possible to promote electron movement in the horizontal direction to prevent deterioration of electron injection efficiency into the active layer 140.

Next, referring back to FIG. 6, a second intermediate layer 137 can be formed on or over the n-type modulation-doped layer 135. Thus, the structure of the n-type nitride semiconductor layer 130 which includes the lower n-type nitride layer 131, the first intermediate layer 133, the n-type modulation-doped layer 135 and the second intermediate layer 137 is completed. The second intermediate layer 137 can include sub-layers. Further, the second intermediate layer 137 can include a sub-layer having a higher n-type doping concentration than an average n-type doping concentration of an n-type modulation-doped layer 135.

The second intermediate layer 137 can be formed to include an alternate stack structure including first sub-intermediate layers and second sub-intermediate layers. The alternate stack structure of the second intermediate layer 137 can be formed by repeatedly growing the first sub-intermediate layer and the second sub-intermediate layer. The first sub-intermediate layer can be grown by supplying of an Al source, Ga and/or In sources, an N source and an n-type dopant source into the growth chamber. The second sub-intermediate layer can be grown by supplying of the Ga and/or In sources and the N source into the growth chamber while stopping the supply of the Al source and the n-type dopant source. Accordingly, the first sub-intermediate layer can have a constant doping concentration and the second sub-intermediate layer can have a lower doping concentration than the first sub-intermediate layer or can be an undoped layer.

In various implementations of the disclosed technology, the thickness of the first and second sub-intermediate layers is not limited to any particular ones and can have different values. As one example, the first sub-intermediate layer can have a thickness of, for example, about 3 nm to about 5 nm, and the second sub-intermediate layer can have a thickness of, for example, about 2 nm to about 4 nm. In one implementation, the thickness of the first sub-intermediate layer is greater than that of the second sub-intermediate layer. Further, the number of cycles of repeatedly stacking the first and second sub-intermediate layers is not particularly limited. However, when the first and second sub-intermediate layers are repeatedly laminated one above another in a predetermined number of cycles or more, a difference in lattice parameter between an active layer 140 and the first or second sub-intermediate layers can be increased, thereby causing deterioration in efficiency of the active layer 140. Accordingly, the first and second sub-intermediate layers can be repeatedly laminated one above another, for example, for 1 to 6 cycles.

Further, the first sub-intermediate layers can have higher energy band-gap than that of the second sub-intermediate layers. The first sub-intermediate layers can have the same doping concentration or different doping concentrations from one another. Alternatively, the doping concentrations of the first sub-intermediate layers can vary according to a stacking sequence. In some implementations, the doping concentration of the first sub-intermediate layers can vary on a regular basis. Further, the first sub-intermediate layers of the second intermediate layer 137 can have a higher doping concentration than the n-type modulation-doped layer 135. Accordingly, it is possible to achieve efficient electron injection from the n-type modulation-doped layer 135 into the active layer 140.

Referring to FIG. 9a, the structure and growth method of a second intermediate layer 137 according to some implementations of the disclosed technology will be described in detail.

As shown in panel (a) of FIG. 9a, the second intermediate layer 137 can include a superlattice structure in which first sub-intermediate layers 137a and second sub-intermediate layers 137b are repeatedly laminated one above another. Referring to panel (b) of FIG. 9a, the second intermediate layer 137 can be grown by repeating a cycle P. During the cycle P, an Al source, a Ga source, an N source, and an n-type dopant source are supplied into the growth chamber for a period of time T1 to grow the first sub-intermediate layer 137a, and the Ga source and the N source are supplied into the growth chamber for a period of time T2 to grow the second sub-intermediate layer 137b while the Al source and the n-type dopant source are not supplied.

In some implementations, during growth of the second intermediate layer 137, an In source can be additionally supplied into the growth chamber. In this case, like the Ga source, the In source can be continuously supplied during growth of the second intermediate layer 137. Alternatively, the In source can be supplied into the growth chamber only during a growth of the second sub-intermediate layer 137b.

When the second sub-intermediate layer 137b is grown to include InGaN, TEGa can be used as the Ga source. Use of TEGa enables formation of the second sub-intermediate layer 137b at a lower growth temperature, whereby the indium content in InGaN can be increased. When the indium content increases in the second sub-intermediate layer 137b, electron mobility can be enhanced, thereby improving luminous efficiency of the light emitting diode including the n-type nitride semiconductor layer 130.

In some implementations, the first sub-intermediate layers 137a included in the second intermediate layer 137 can have a higher doping concentration than the n-type modulation-doped layer 135. The first sub-intermediate layers 137a can have a doping concentration of, for example, $1 \times 10^{18}$ atoms/cm$^3$ or more, $5 \times 10^{19}$ atoms/cm$^3$ or more, or $2.9 \times 10^{20}$ atoms/cm$^3$ or more. In addition, the first sub-intermediate layers 137a can have an Al composition ratio in the range of about 0.02 to about 0.2.

As such, as the superlattice layer is formed as the second intermediate layer 137, it is possible to prevent propagation of defects such as dislocation towards the active layer 140. Furthermore, as the second intermediate layer 137 includes the first sub-intermediate layers 137a having a relatively high doping concentration, it is possible to improve electron injection efficiency into the active layer 140 and prevent increase or decrease in forward voltage of the light emitting diode including an n-type nitride semiconductor layer 130. More specifically, the first sub-intermediate layers 137a having a relatively high energy band-gap and the second sub-intermediate layers 137b having a relatively low energy band-gap are laminated in the superlattice structure, thereby forming a quantum-well structure. At this time, since the first sub-intermediate layers 137a are formed to have a relatively high doping concentration, the first sub-intermediate layers 137a can provide a number of electrons to the second intermediate layer 137 and a large amount of electrons among electrons disposed in a conduction band can be moved into the active layer 140 instead of being trapped in the quantum well. As a result, the second intermediate layer 137 can prevent deterioration in electron injection efficiency, while securing other functions such as defect prevention.

Further, the stack structure including repeatedly stacked first sub-intermediate layers 137a and second sub-intermediate layers 137b allows a two-dimensional electron gas (2DEG) to be formed at each interface, thereby facilitating movement of electrons in vertical and horizontal directions. Thus, the light emitting diode including the nitride semiconductor layer structure as provided according to some implementations of the disclosed technology has reduced resistance in the vertical and horizontal directions, thereby providing a low forward voltage while improving current spreading.

In some implementations, a low doping concentration region can be formed at an uppermost portion of the n-type modulation-doped layer 135. In this case, the second intermediate layer 137 can be grown on the low doping concentration region. Accordingly, the low doping concentration region of the n-type modulation-doped layer 135 can adjoin the second intermediate layer 137. The low doping concentration region formed at the uppermost portion of the n-type modulation-doped layer 135 can act as a 2DEG channel of the second intermediate layer 137 that adjoins the low doping concentration region. This structure provides easier current spreading in the horizontal direction.

FIG. 9b shows a cross-sectional view and a graph that respectively illustrate a structure and flux-time relationships of an n-type dopant source, a Ga source, an Al source, and an N source supplied to a growth chamber when growing a second intermediate layer 137' according to some implementations of the disclosed technology.

As shown in (a) of FIG. 9b, the second intermediate layer 137' can include a superlattice structure in which one of first sub-intermediate layers 137c, 137d, 137f and a second sub-intermediate layer 137b are repeatedly laminated one above another. Unlike the second intermediate layer shown in FIG. 9a, in this implementation, doping concentrations of the first sub-intermediate layers 137c, 137d, 137f included in the second intermediate layer 137' can vary depending upon locations thereof.

Referring to (b) of FIG. 9b, in a first cycle P1, the first sub-intermediate layer 137c is grown by supplying an Al source, a Ga source, an N source, and an n-type dopant source into the growth chamber for a predetermined period of time, and then the second sub-intermediate layer 137b is grown by supplying only the Ga source and the N source into the growth chamber for a predetermined period of time while stopping supply of the Al source and the n-type dopant source. In the first cycle P1, the n-type dopant source is supplied at a first flux f1 into the growth chamber. Thereafter, in a second cycle P2, the first sub-intermediate layer 137d and the second sub-intermediate layer 137b are grown by a similar process to that of the first cycle P1, while increasing the flux of the n-type dopant source to a second flux f2. In a third cycle P3, the first sub-intermediate layer 137f and the second sub-intermediate layer 137b are grown by a similar process to that of the second cycle P2, while increasing the flux of the n-type dopant source to a third flux f3. Accordingly, the doping concentrations of the first sub-intermediate layers 137c, 137d and 137f can increase in the growth direction of the first sub-intermediate layers 137c, 137d and 137f. Therefore, as will be described later, the first sub-intermediate layer 137f disposed closer to an active layer 140 can have a higher doping concentration than the first sub-intermediate layer 137c disposed farther from the active layer 140. As a result, the n-type nitride semiconductor layer 130 can provide further improved electron injection efficiency into the active layer 140.

Referring back to FIG. 7, the active layer 140 and a p-type nitride semiconductor layer 150 are formed on or over the n-type nitride semiconductor layer 130, thereby providing a semiconductor stack structure as shown in FIG. 7.

The active layer 140 can include a nitride-based semiconductor such as (Al, Ga, In)N and can be grown on or over the n-type nitride semiconductor layer 130 by a suitable process. Various techniques such as MOCVD, MBE, or HVPE can be used for growing the active layer 140. In addition, the active layer 140 can have a multi-quantum well (MQW) structure which includes barrier layers and well layers. Here, elements and compositions of the semiconductor layers forming the multi-quantum well (MQW) structure can be adjusted to emit light having a desired peak wavelength.

The p-type nitride semiconductor layer 150 can include a nitride-based semiconductor such as (Al, Ga, In)N and can be grown on the active layer 140 by a suitable process. Various techniques such as MOCVD, MBE, or HVPE can be used for growing the p-type nitride semiconductor layer 150. The p-type nitride semiconductor layer 150 can include a p-type dopant, for example, Mg.

Figure 14:
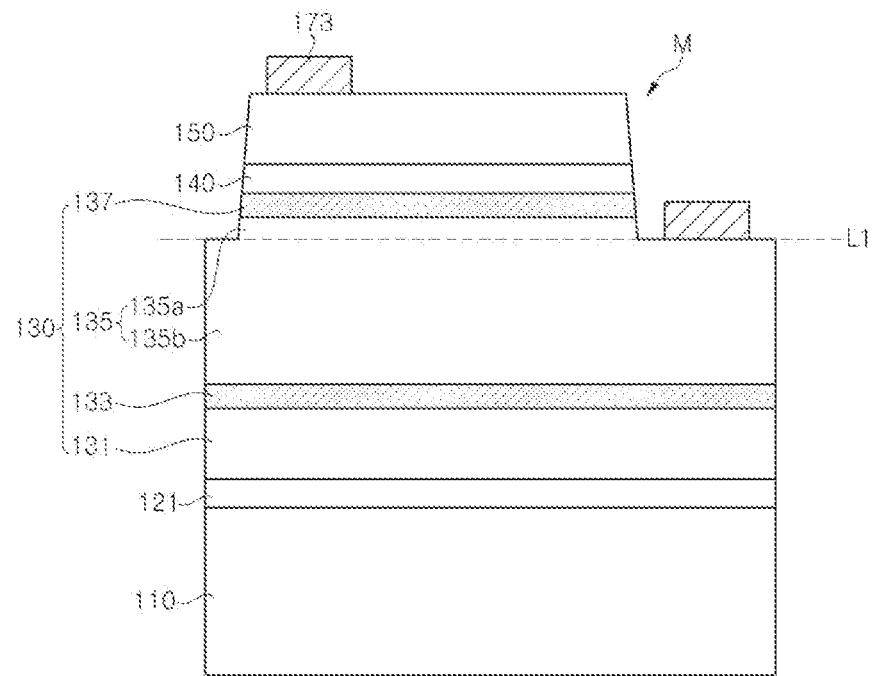
FIG. 14 is a cross-sectional view of an exemplary light emitting diode according to some implementations of the disclosed technology.
Figure 15:
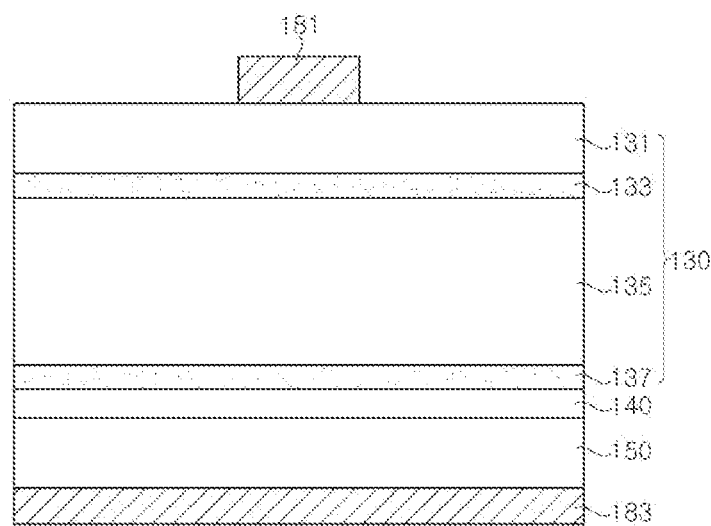
FIG. 15 is a cross-sectional view of an exemplary light emitting diode according to some implementations of the disclosed technology.

By performing an additional process to complete the semiconductor stack structure, a light emitting diode as shown in, for example, FIG. 14 or FIG. 15, can be provided. This will be described later in more detail by referring to FIGS. 14 and 15.

Figure 10:
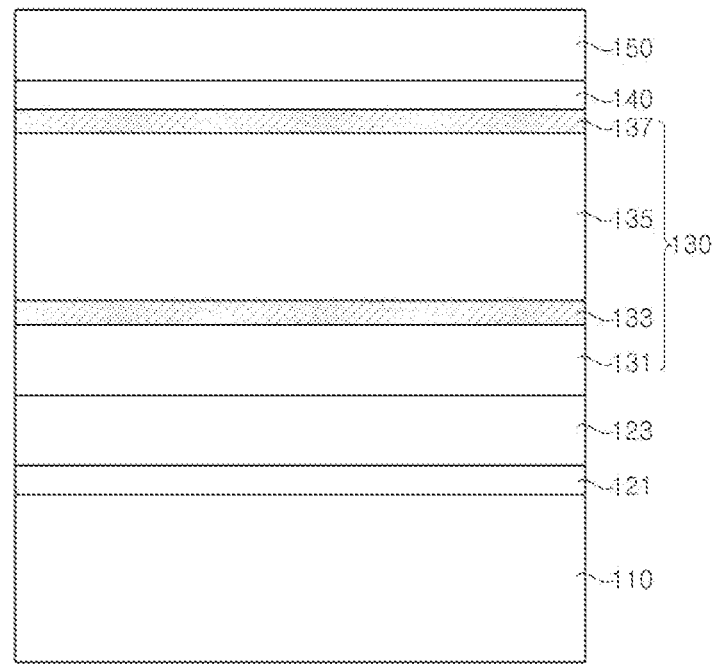
FIG. 10 is a cross-sectional view illustrating an exemplary method of growing an n-type nitride semiconductor layer according to some implementations of the disclosed technology.

FIG. 10 is a cross-sectional view illustrating a method of growing an n-type nitride semiconductor layer according to one embodiment of the disclosed technology.

As compared with the implementations described with reference to FIG. 1 to FIG. 7, the semiconductor stack structure of FIG. 10 further includes an undoped nitride semiconductor layer 123. The differences between the implementation in FIG. 10 and the implementation in FIGS. 1 to 7 are mainly explained, and the descriptions of the same components will be omitted.

An undoped nitride semiconductor layer 123 can be formed on or over a buffer layer 121 by supplying a Group III element source and an N source into a growth chamber to grow a nitride semiconductor including (Al, Ga, In)N without supplying an n-type or p-type dopant source.

In this manner, the undoped nitride semiconductor layer 123 can be grown before growth of an n-type nitride semiconductor layer 130. The undoped nitride semiconductor layer 123 does not include an impurity such as an n-type or p-type dopant and thus exhibits excellent crystal quality. Thus, the undoped nitride semiconductor layer 123 provides improved crystal quality of other semiconductor layers to be grown thereon by subsequent processes.

Next, the n-type nitride semiconductor layer 130, an active layer 140 and a p-type nitride semiconductor layer 150 are formed on or over the undoped nitride semiconductor layer 123, thereby providing a semiconductor stack structure as shown in FIG. 10. Light emitting diodes having various structures can be provided by performing an additional process as needed.

Figure 11:
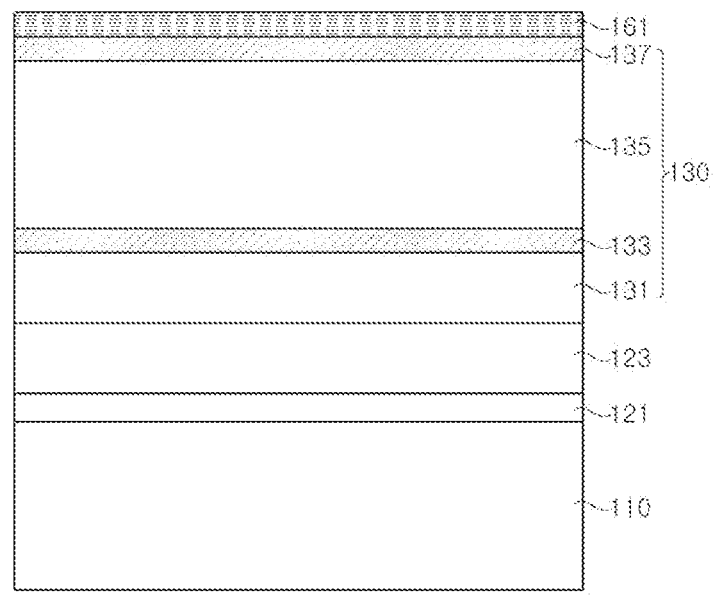
FIG. 11 to FIG. 13 are cross-sectional views illustrating an exemplary method of growing an n-type nitride semiconductor layer, according to some implementations of the disclosed technology.
Figure 12:
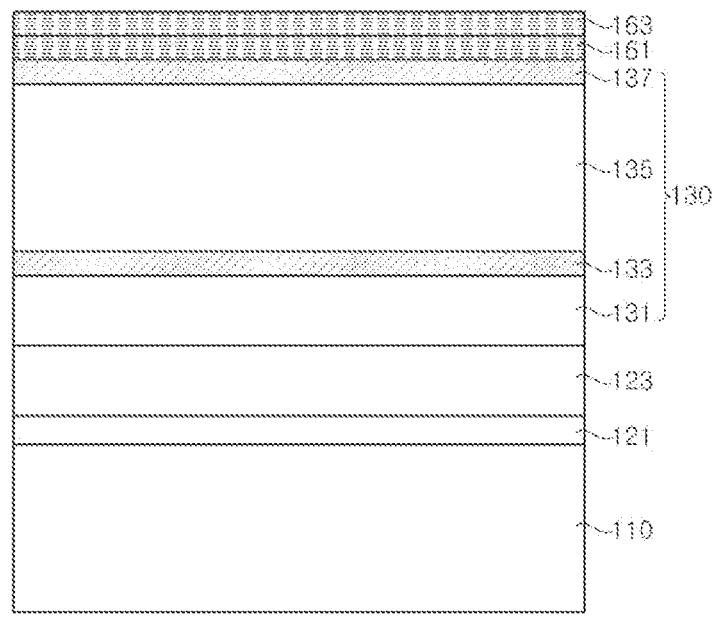
Figure 13:
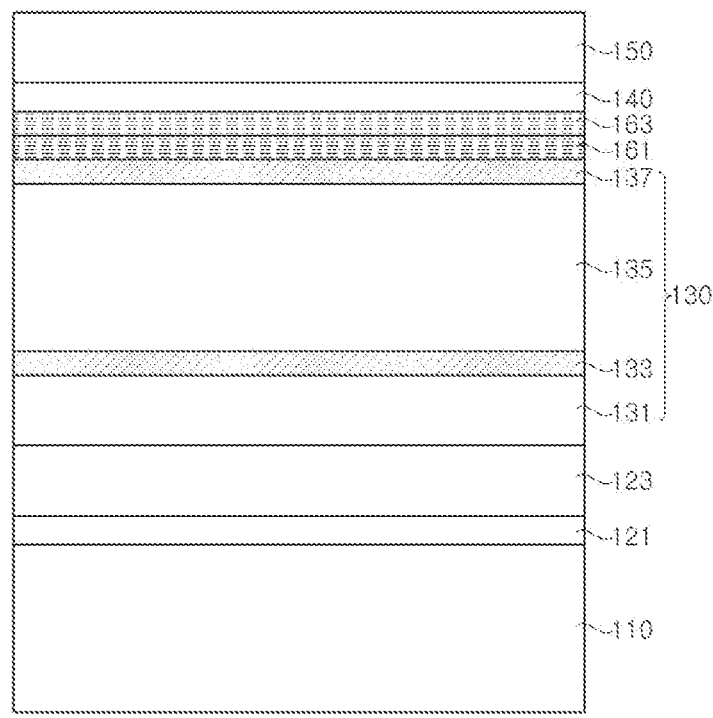

FIG. 11 to FIG. 13 are cross-sectional views illustrating a method of growing an n-type nitride semiconductor layer and a semiconductor stack structure according to some implementations of the disclosed technology.

As compared with the implementations described with reference to FIG. 10, the implementations shown in FIG. 11 to FIG. 13 further include forming a first superlattice layer 161 and a second superlattice layer 163. The differences between the implementation provided in FIG. 11 to FIG. 13 and the implementation provided in FIG. 10 will be mainly described, and descriptions of the same components will be omitted. In some implementations, the undoped nitride semiconductor layer 123 can be omitted.

First, referring to FIG. 11, a buffer layer 121, an undoped nitride semiconductor layer 123 and an n-type nitride semiconductor layer 130 are formed on or over a substrate 110, and the first superlattice layer 161 is formed on or over the n-type nitride semiconductor layer 130.

The first superlattice layer 161 can be formed by supplying a Group III element source, such as Al, Ga, or In, and the like, and a Group V element source such as N into the growth chamber such that layers having different compositions are repeatedly laminated one above another. For example, the first superlattice layer 161 can have a stack structure in which InGaN layers and GaN layers are repeatedly laminated one above another.

The first superlattice layer 161 prevents stress and strain caused by lattice mismatch from propagating to the active layer 140, and prevents propagation of defects such as dislocation, thereby improving crystal quality of the active layer 140.

Referring to FIG. 12, the second superlattice layer 163 is formed on or over the first superlattice layer 163. The second superlattice layer 163 can be formed by supplying the Group III element source, such as Al, Ga, or In, and the like, and the Group V element source such as N into the growth chamber such that layers having different compositions are repeatedly laminated one above another. Particularly, the second superlattice layer 163 can have a stack structure in which $Al_xGa_{(1-x)}N$ layers and $Al_yGa_{(1-y)}N$ layers (0<x<1, 0<y<1, y<x) are repeatedly laminated one above another, wherein the $Al_xGa_{(1-x)}N$ layers are undoped layers and the $Al_yGa_{(1-y)}N$ layers are n-type doped layers.

Further, the compositions of the $Al_xGa_{(1-x)}N$ layers and the $Al_yGa_{(1-y)}N$ layers can be determined such that the $Al_xGa_{(1-x)}N$ layers have a higher energy band-gap than the barrier layers of the active layer 140, and the $Al_yGa_{(1-y)}N$ layers have a higher energy band-gap than the well layers of the active layer 140. Accordingly, electron mobility is decreased within the second superlattice layer 163, whereby a light emitting diode including the semiconductor stack structure according to some implementations has further improved luminous efficiency.

Next, referring to FIG. 13, the active layer 140 and the p-type nitride semiconductor layer 150 can be formed on or over the second superlattice layer 163, thereby providing a semiconductor stack structure as shown in FIG. 13. Light emitting diodes having various structures can be provided by performing an additional process as needed.

FIG. 14 is a cross-sectional view of a light emitting diode according to one embodiment of the disclosed technology.

Figure 7:
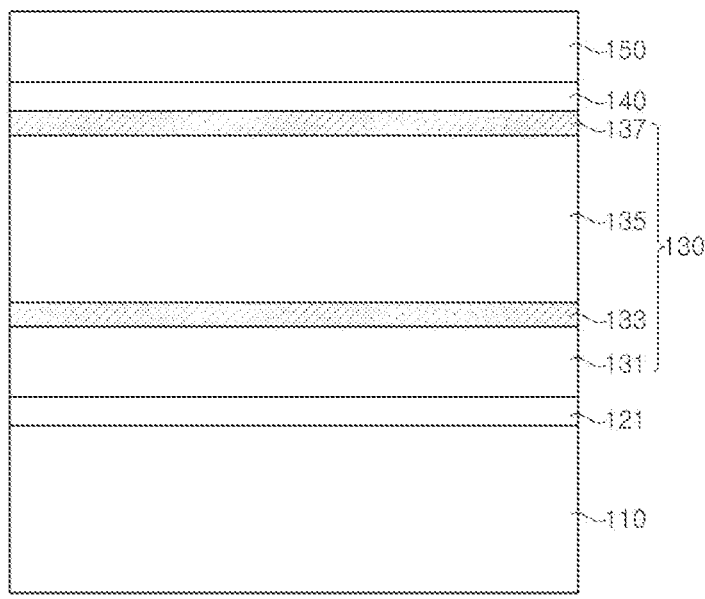

Referring to FIG. 14, the light emitting diode can be fabricated using the semiconductor stack structure of FIG. 7.

Specifically, a method of fabricating the light emitting diode can include forming a mesa structure M by partially removing the p-type nitride semiconductor layer 150, the active layer 140 and the n-type nitride semiconductor layer 130 from the semiconductor stack structure of FIG. 7. In addition, the method of fabricating the light emitting diode can further include forming a first electrode 171 and a second electrode 173. As a result, a lateral type light emitting diode as shown in FIG. 14 can be provided. The lateral type light emitting diode can be applied to a flip-chip type light emitting diode.

The mesa structure M can be formed by, for example, photolithography and etching. With the mesa structure M, the light emitting diode can include a region through which the n-type nitride semiconductor layer 130 is partially exposed. The n-type modulation-doped layer 135 can be partially exposed in the region through which the n-type nitride semiconductor layer 130 is partially exposed. The mesa structure M can include a portion of the n-type nitride semiconductor layer 130, the active layer 140, and the p-type nitride semiconductor layer 150. Particularly, the mesa structure M can include the second intermediate layer 137 and the n-type modulation-doped layer 135 of the n-type nitride semiconductor layer 130. Accordingly, a portion of the n-type modulation-doped layer 135 can be disposed above virtual line L1 corresponding to a bottom surface of the mesa structure M.

Here, a portion of the n-type modulation-doped layer 135 disposed above the virtual line L1 can have a different doping concentration than that of a portion of the n-type modulation-doped layer 135 disposed below the virtual line L1. In addition, the portion of the n-type modulation-doped layer 135 disposed above the virtual line L1 can have a higher doping concentration than the portion of the n-type modulation-doped layer 135 disposed below the virtual line L1.

A first electrode 171 and a second electrode 173 can be formed on or over the n-type nitride semiconductor layer 130 and the p-type nitride semiconductor layer 150, respectively. In some implementations, the first electrode 171 can be formed on the n-type modulation-doped layer 135.

The first intermediate layer 133 can be disposed under the n-type modulation-doped layer 135 to prevent loss of electrons from the n-type nitride semiconductor layer 130, and the first electrode 171 directly adjoins the n-type modulation-doped layer 135 to allow electrons to be directly injected into the n-type modulation-doped layer 135. With this structure, it is possible to prevent loss of electrons due to crystal defects in the n-type nitride semiconductor layer 130 while improving lateral spreading of the electrons.

Further, the n-type modulation-doped layer 135 can be formed such that an upper region of the n-type modulation-doped layer 135 contacting the first electrode 171 has a higher doping concentration than a lower region of the n-type modulation-doped layer 135, thereby preventing propagation of electrons to a region under the virtual line L1 while improving injection efficiency of electrons towards the active layer 140.

FIG. 15 is a cross-sectional view of a light emitting diode according to one embodiment of the disclosed technology.

A method of fabricating the light emitting diode can include removing the substrate 110 from the semiconductor stack structure of FIG. 7, forming a first electrode 181 on an exposed region of the n-type nitride semiconductor layer 130 formed by removing the substrate 110 while forming a second electrode 183 on or over the p-type nitride semiconductor layer 150. As a result, a vertical type light emitting diode as shown in FIG. 15 can be provided.

Although the light emitting diodes of FIG. 14 and FIG. 15 are illustrated as being fabricated using the semiconductor stack structure of FIG. 7, it should be understood that the disclosed technology is not limited hereto and the light emitting diodes can be fabricated using other semiconductor stack structures, for example, as shown in FIG. 10 or FIG. 13. In addition, although only the typical vertical type or lateral type light emitting diodes are illustrated in the above implementations, it should be understood that the disclosed technology is not limited hereto and the n-type nitride semiconductor layer and the semiconductor stack structure according to the disclosed technology can be applied to any light emitting diodes having various structures.

The light emitting diodes according to the embodiments of the disclosed technology include the n-type modulation-doped layer 135 to allow uniform spreading of current injected into the n-type modulation-doped layer 135, whereby current can be effectively distributed within the semiconductor layers. Further, the light emitting diodes according to the embodiments of the disclosed technology include the n-type modulation-doped layer 135 disposed between the first and second intermediate layers 131 and 135, thereby securing excellent crystallinity of the semiconductor layers and excellent efficiency of current injection into the active layer 140. Therefore, the disclosed technology provides light emitting diodes which have improved luminous efficiency and reduced forward voltage.

Only a few embodiments, implementations and examples are described and other embodiments and implementations, and various enhancements and variations can be made based on what is described and illustrated in this document.

What is claimed is:
1. A light emitting device comprising:
an n-type nitride semiconductor layer;
an active layer disposed over the n-type nitride semiconductor layer; and
a p-type nitride semiconductor layer disposed over the active layer,
the n-type nitride semiconductor layer comprising:

an n-type nitride base layer having a first dopant concentration;

a first intermediate layer disposed over the n-type nitride base layer and having a different semiconductor material from the n-type nitride base layer, the first intermediate layer including Aluminum (Al), and;

an n-type modulation-doped layer disposed over the first intermediate layer and having multiple pairs, each pair including a first portion with a second dopant concentration greater than the first dopant concentration and a second portion with a third dopant concentration lower than the second dopant concentration; and a second intermediate layer disposed over the first portion of the n-type modulation-doped layer and including a superlattice layer including a stacked structure of first sub-intermediate layer including Al without Indium (In) and a second sub-intermediate layer including In without Al, the second sub-intermediate layer having a lower doping concentration than the first sub-intermediate layer; and an electrode disposed over the second portion of the n-type modulation-doped layer to provide a direct contact with the n-type modulation-doped layer, wherein the second intermediate layer includes a sub-layer having a higher n-type doping concentration than an n-type doping concentration of the n-type modulation-doped layer.

2. The light emitting device of claim 1, wherein the first sub-intermediate layers has an n-type dopant concentration of about $1 \times 10^{18}$ atoms/cm$^3$ or more.

3. The light emitting device of claim 2, wherein the n-type modulation-doped layer has an n-type dopant concentration equal to or more than about $2 \times 10^{19}$ atoms/cm$^3$, and the doping concentration of the n-type modulation-doped layer is lower than that of the first sub-intermediate layers of the second intermediate layer.

4. The light emitting device of claim 1, wherein the n-type modulation doped layer has a doping concentration that spatially varies from one of the first portion positioned farther from the second intermediate layer to another first portion positioned close to the second intermediate layer.

5. The light emitting device of claim 1, wherein one of the first sub-intermediate layers that is disposed relatively closer to the active layer has a higher doping concentration than other first sub-intermediate layers that are disposed relatively farther from the active layer.

6. The light emitting device of claim 1, further including:

a first superlattice layer disposed between the n-type nitride semiconductor layer and the active layer; and a second superlattice layer disposed between the first superlattice layer and the active layer, wherein the first superlattice layer includes a structure in which GaN layers and InGaN layers are repeatedly laminated one above another, and the second superlattice layer includes a structure in which $Al_xGa_{(1-x)}N$ layers and $Al_yGa_{(1-y)}N$ layers (0<x<1, 0<y<1, and y<x) are repeatedly laminated one above another.

7. The light emitting device of claim 1, wherein the n-type modulation-doped layer includes a structure including relatively high doping concentration regions and relatively low doping concentration regions that form a stacked structure, and the n-type modulation-doped layer includes a relatively low doping concentration region at an uppermost portion of the n-type modulation-doped layer such that the second intermediate layer contacts with the relatively low doping concentration region.

8. The light emitting device of claim 1, further including:

an undoped nitride semiconductor layer disposed between the n-type nitride base layer and the first intermediate layer.

9. A light emitting device, including:

a first-impurity nitride-based layer formed over a substrate and having a relatively low doping concentration;

a first intermediate layer formed over the first-impurity nitride-based layer and having a different composition than that of the first-impurity nitride-based layer, the first intermediate layer including Aluminum (Al);

a first-impurity modulation-doped layer formed over the first intermediate layer and having first portions and second portions having a dopant concentration lower than that of the first portions, the first-impurity modulation-doped layer having a non-exposed portion and an exposed portion that have different impurity concentrations from each other, the non-exposed portion being formed over the exposed portion;

a second intermediate layer formed over the exposed portion of the first-impurity modulation-doped layer and including first sub-intermediate layers including Al without In and second sub-intermediate layers including In without Al that are alternately disposed relative to each other, the first sub-intermediate layers having a higher impurity concentration than that of the second sub-intermediate layers; and an electrode disposed over the exposed portion of the first-impurity modulation-doped layer and providing a direct contact with the first-impurity modulation-doped layer, and wherein the exposed portion of the first-impurity modulation-doped layer and the second intermediate layer form a mesa structure together with an active layer and a second-impurity nitride semiconductor layer that are formed over the second intermediate layer.

10. The light emitting device of claim 9, wherein the impurity concentration of the first-impurity modulation-doped layer is modulated to include high doping concentration not more than about $1 \times 10^{19}$ atoms/cm$^3$ and a low doping concentration not less than about $1 \times 10^{18}$ atoms/cm$^3$.

11. The light emitting device of claim 9, wherein the second sub-intermediate layers have a lower impurity concentration than the first sub-intermediate layers.

12. The light emitting device of claim 10, wherein the first sub-intermediate layers have a relative high energy band gap that facilitates electrons to be moved to the active layer.

13. The light emitting device of claim 9, wherein the second sub-intermediate layers have a greater thickness than the first sub-intermediate layers.

14. The light emitting device of claim 9, wherein the first sub-intermediate layers have a higher doping concentration than the first-impurity modulation layer.

15. The light emitting device of claim 9, wherein the alternate arrangement of the first sub-intermediate layers and second sub-intermediate layers in the second intermediate layer allows a two-dimensional electron gas (2DEG) to be formed at each interface of the first and second sub-intermediate layers.

16. The light emitting device of claim 9, wherein the first sub-intermediate layer disposed closer to the active layer as compared to other first sub-intermediate layers has a higher doping concentration than other first sub-intermediate layers.

17. The light emitting diode of claim 1, wherein the second intermediate layer includes a superlattice layer including a first sub-intermediate layer and a second sub-intermediate layer, the second sub-intermediate layer having an indium content greater than the first sub-intermediate layer.

18. The light emitting diode of claim 9, wherein the second sub-intermediate layer has an indium content greater than the first sub-intermediate layer.

* * * * *